United States Patent [19]
Chan et al.

[11] Patent Number: 5,610,083
[45] Date of Patent: Mar. 11, 1997

[54] METHOD OF MAKING BACK GATE CONTACT FOR SILICON ON INSULATOR TECHNOLOGY

[75] Inventors: Láp Chan, San Francisco, Calif.; Ravis H. Sundaresan; Che-Chia Wei, both of Plano, Tex.

[73] Assignee: Chartered Semiconductor Manufacturing Pte LTD, Singapore, Singapore

[21] Appl. No.: 650,697

[22] Filed: May 20, 1996

[51] Int. Cl.⁶ .................................................. H01L 21/84
[52] U.S. Cl. .......................... 437/21; 437/60; 437/918; 437/41
[58] Field of Search .................................. 437/21, 41, 52, 437/60, 918

[56] References Cited

U.S. PATENT DOCUMENTS

| | | | |
|---|---|---|---|
| 5,185,280 | 2/1993 | Houston et al. | 437/44 |
| 5,241,211 | 8/1993 | Tashiro | 257/506 |
| 5,294,821 | 3/1994 | Iwamatsu | 257/351 |
| 5,414,288 | 5/1995 | Fitch et al. | 257/328 |
| 5,573,961 | 11/1996 | Hsu et al. | 437/21 |

Primary Examiner—John Niebling
Assistant Examiner—Richard A. Booth
Attorney, Agent, or Firm—George O. Saile

[57] ABSTRACT

A process for creating a back gate contact, in an SOI layer, that can easily be incorporated into a MOSFET fabrication recipe, has been developed. The back gate contact consists of a etched trench, lined with insulator, and filled with doped polysilicon. The polysilicon filled trench electrically connects the semiconductor substrate to overlying metal contacts.

28 Claims, 6 Drawing Sheets

METHOD OF MAKING BACK GATE CONTACT FOR SILICON ON INSULATOR TECHNOLOGY

BACKGROUND OF THE INVENTION (1) Field of the Invention

This invention relates to the fabrication of a semiconductor device, and more specifically to semiconductor devices fabricated from silicon on insulator, (SOI), technology.

(2) Description of Prior Art

A critical objective of the semiconductor industry has been to continually increase the performance of silicon devices. The ability to reduce performance degrading, parasitic capacitances, resulting from diffusion to semiconductor substrate capacitances, has been accomplished via use of the silicon on insulator, (SOI), technology. The SOI technology consists of forming the desired devices in a layer of silicon, which overlies an insulator layer, which in turn overlies a semiconductor substrate. However the insulator layer in the SOI structure presents specific problems in achieving the desired device characteristics. For devices or transistors, fabricated using conventional, or without SOI technology, electrical contact to the semiconductor substrate is easily made. For example in metal oxide semiconductor field effect transistors, (MOSFET), devices, contact to a semiconductor substrate is made via use of the body node, or the undepleted material, directly under the gate electrode. However for SOI devices the body node is electrically floating, isolated from the substrate by the underlying insulator. This situation can result in undesirable drain currents, and lower threshold voltages. Other unwanted device characteristics, such as capacitive coupling between the body node and the source and drain regions, also adversely influence threshold voltages. Therefore efforts have been directed at developing processes that allow electrical contacts to obtained to the body node of the SOI layer, such as Houston, et al, in U.S. Pat. No. 5,185,280, or processes that allow electrical contact to the semiconductor substrate, such as Tashiro, in U.S. Pat. No. 5,241,211.

This invention will describe a process for fabricating MOSFET devices in an SOI layer, in which a back gate contact, or direct contact to the semiconductor substrate, is made without adding significant complexity to a process used to fabricate the desired MOSFET device.

SUMMARY OF THE INVENTION

It is an object of this invention to fabricate MOSFET devices in a SOI layer.

It is another object of this invention to provide a process sequence which allows polysilicon resistors to be easily fabricated using the identical process steps used to fabricate the MOSFET devices in the SOI layer.

It is still another object of this invention to provide a back gate contact, for MOSFETs fabricated in an SOI layer, to a semiconductor substrate.

In accordance with the present invention a P type, single crystalline silicon layer is present on an insulator layer, which in turn overlies a semiconductor substrate. A silicon dioxide layer is thermally grown, to be used as the gate insulator. A polysilicon layer is grown, doped via ion implantation processes, and patterned to produce a polysilicon structure. A thin silicon dioxide film is thermally grown on the exposed surfaces of the polysilicon structure. A layer of silicon oxide is next deposited, followed by patterning and etching, to create a trench in the silicon oxide, polysilicon structure, gate oxide, and SOI, composite layers. A spacer insulator is formed on the sides of the trench, with an spacer overetch performed to extend the trench through the insulator layer, of the SOI composite, with the trench now reaching the surface of the semiconductor substrate. A second layer of polysilicon is deposited, using insitu doping processes, completely filling the trench. Chemical mechanical polishing is performed to remove the unwanted regions, of the second polysilicon layer, from all areas excluding the polysilicon filled trench, followed by another chemical mechanical polishing procedure, used to planarize the silicon oxide layer, to a level in which the surface of the polysilicon structure is exposed. A third layer of polysilicon is deposited and doped via ion implantation processing. Patterning and etching is next performed, to the third polysilicon layer, to create a polysilicon contact to the polysilicon filled trench, which in turn contacts the semiconductor substrate. In a different area, patterning and etching of the third polysilicon layer, and the underlying polysilicon structure, create a composite polysilicon gate structure, to be used for subsequent MOSFET formation, overlying the gate oxide and the silicon of the SOI composite. In addition, in still another area, patterning and etching of the third polysilicon layer, overlying a silicon oxide layer, results in the formation of a polysilicon resistor. Photoresist masking to expose the subsequent MOSFET region, followed by ion implantation, is used to create the source and drain regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
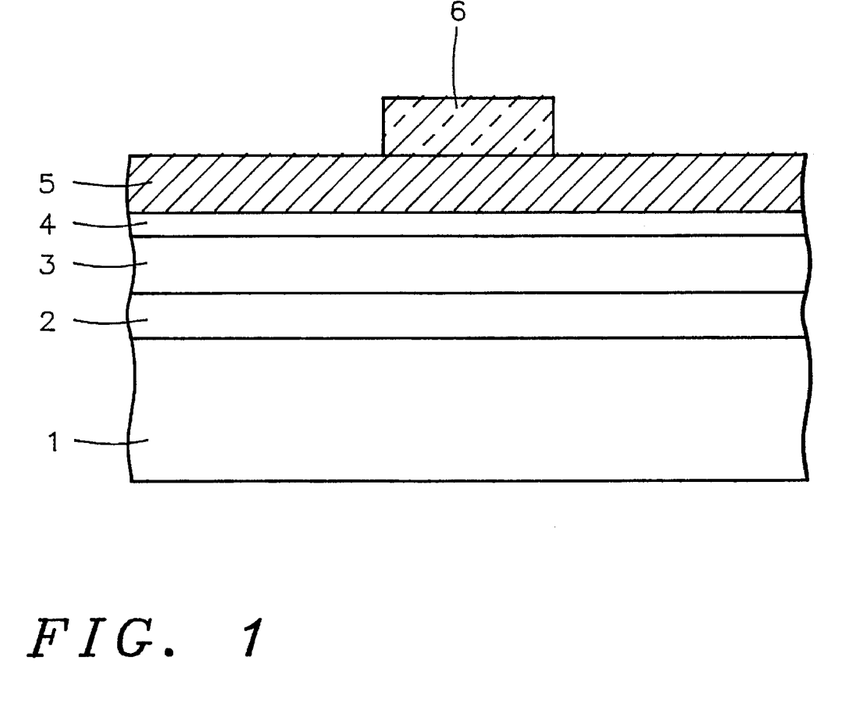
FIGS. 1–2, schematically showing, in cross-sectional style, the creation of the SOI layer and the early stages of creating a trench for the back gate contact structure.

The method of creating a back gate contact, to a SOI layer, containing MOSFET devices, will now be described. FIG. 1, shows a starting substrate, 1, with a silicon oxide region, 2. A layer of silicon, 3, (SOI), resides on the silicon oxide layer creating the silicon on insulator, SOI, composite. The method used to produce the SOI layer is SIMOX, (Separation by IMplanted OXygen). This method results in a buried oxide layer, 2, of between about 3000 to 4000 Angstroms of silicon oxide, with an overlying silicon on insulator layer, 3, (SOI), of between about 800 to 3000 Angstroms of single crystalline silicon. The SOI layer, 3, has a resistivity between about 5 to 25 ohm-cm, with a defect density of less than about 1E5 defects/cm$^2$.

Figure 2:
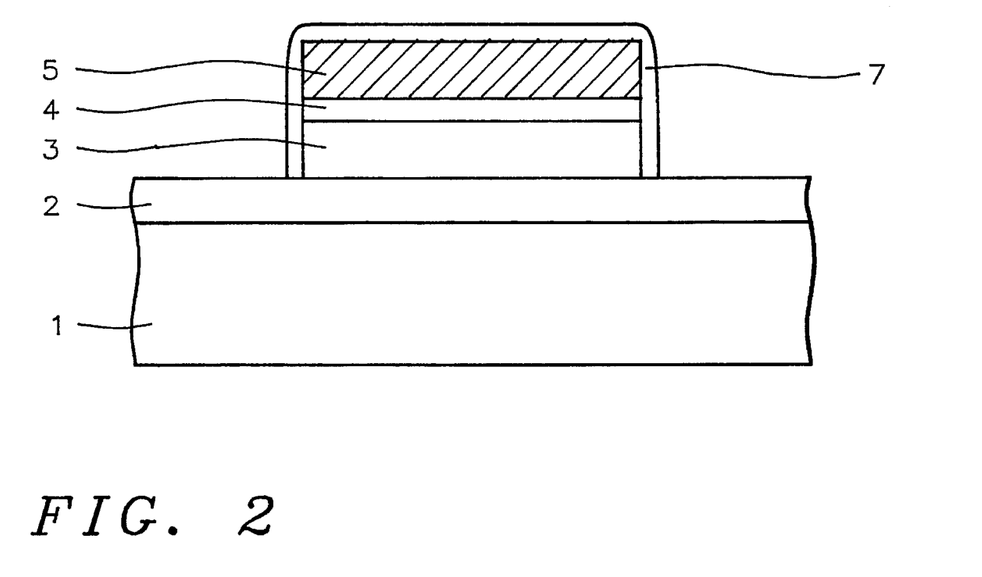

After careful wet cleans, including a buffered hydrofluoric exposure, a thin silicon dioxide layer, 4, to be used as a gate insulator for subsequent MOSFET devices, is thermally grown in an oxygen—steam ambient, at a temperature between about 800° to 900° C., to a thickness between about 50 to 200 Angstroms. A first polysilicon layer, 5, is next deposited, using low pressure chemical vapor deposition, (LPCVD), processing, at a temperature between about 600° to 650° C, to a thickness between about 1500 to 4000 Angstroms. The polysilicon layer, 5, is doped via ion implantation of phosphorous, at an energy between about 30 to 70 Kev., at dose between about 1E14 to 1E16 atoms/cm$^2$. Next photolithographic processing is used to create photoresist shape, 6, shown schematically in FIG. 1. The photoresist shape, 6, is used as a mask to allow anisotropic, reactive ion etching, (RIE), of polysilicon layer, 5, to occur, using a Cl$_2$, or Cl$_2$—HBr, etch chemistry. After photoresist removal, via oxygen plasma ashing, followed by careful wet cleans, a sidewall oxide film, 7, is thermally grown, in an oxygen —steam ambient, at a temperature between about 850° to 925° C., to a thickness between about 100 to 300 Angstroms. This is shown FIG. 2.

Figure 3:
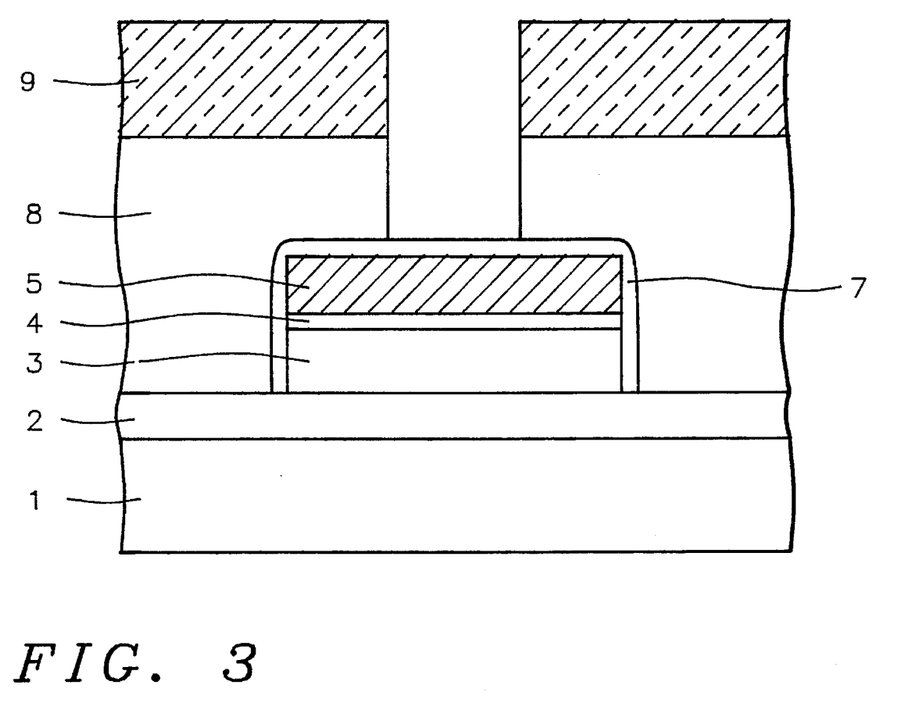
FIGS. 3–7, which schematically shows the creation of the polysilicon filled trench, used for the back gate contact.
Figure 4:
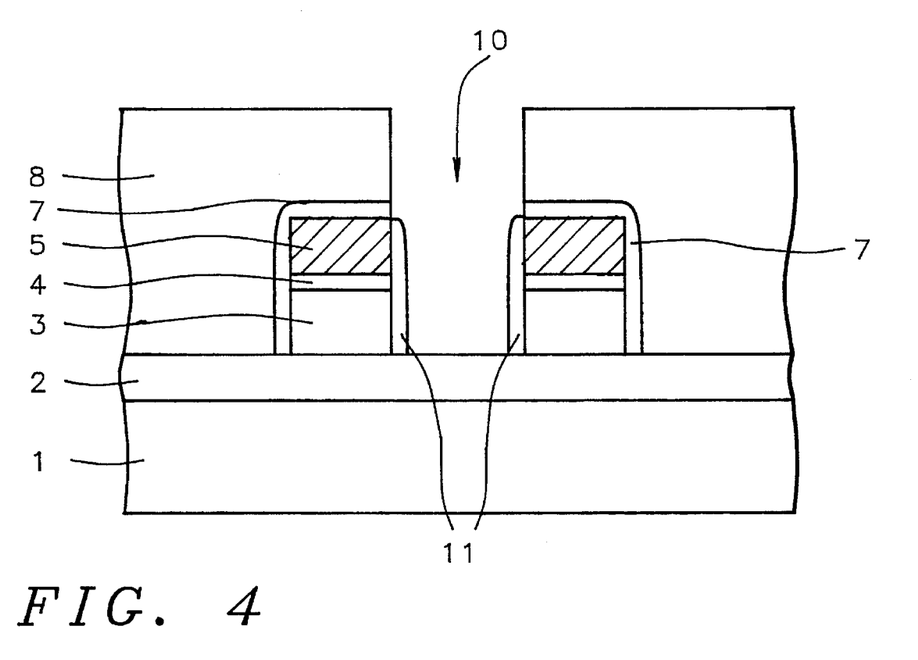

A silicon oxide layer, 8, is now deposited using either LPCVD or plasma enhanced chemical vapor deposition, (PECVD), processing, and using tetraethylorthosilicate as a source, at a temperature between about 400° to 850° C., to a thickness between about 3000 to 5000 Angstroms. Photolithographic processing is again employed to create photoresist shape, 9, shown schematically in FIG. 3. Selective, anisotropic, RIE processing is used to create the trench, 10, shown in FIG. 4. The RIE procedure initially uses a CHF$_3$—CF$_4$ chemistry to etch through silicon oxide layer, 7, followed by a Cl$_2$, or Cl$_2$—HBr RIE procedure to etch through polysilicon layer, 5. After another CHF$_3$—CF$_4$ procedure to break through silicon dioxide layer, 4, a Cl$_2$, or Cl$_2$—HBr, etch is again employed to continue creating the trench through SOI layer, 3, stopping on silicon oxide, insulator layer, 2. After photoresist removal, using oxygen plasma ashing followed by wet cleans, another sidewall oxide layer, 11, is formed on the exposed sides of trench, 10.

Figure 5:
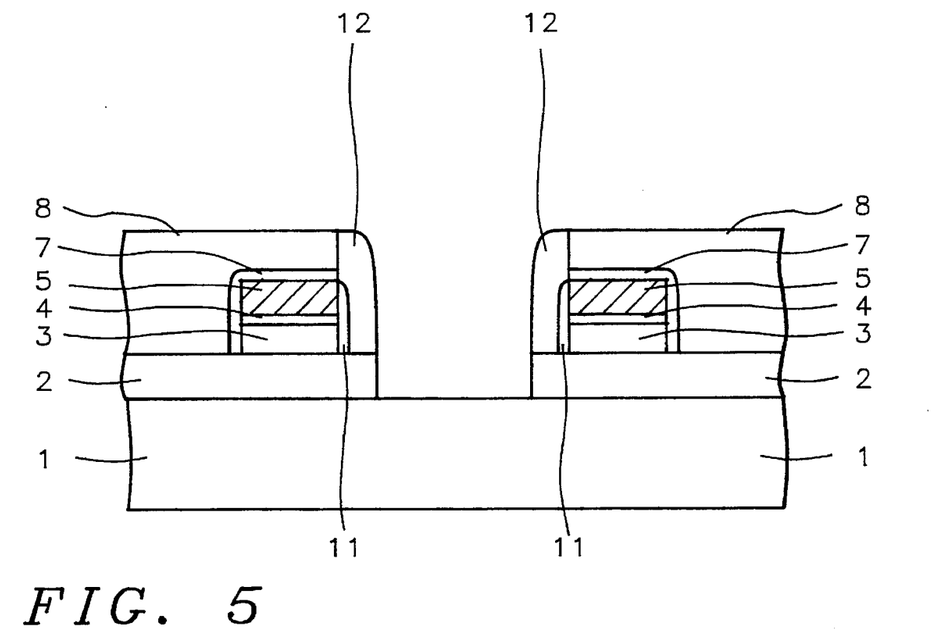

Next the spacer oxide, 12, is formed, first by deposition of a silicon oxide layer, using either LPCVD or PECVD processing, at a temperature between about 400° to 850° C., to a thickness between about 2000 to 5000 Angstroms. Next a selective, anisotropic, RIE procedure, using CHF$_3$—CF$_4$ as an etchant, is used to remove the silicon oxide layer from horizontal surfaces, creating the spacer oxide, 12, with a significant overetch employed to extend the trench through silicon oxide layer, 2, now reaching the surface of semiconductor substrate, 1. The overetch also results in a thinning of silicon oxide layer, 8. This is shown in FIG. 5.

Figure 6:
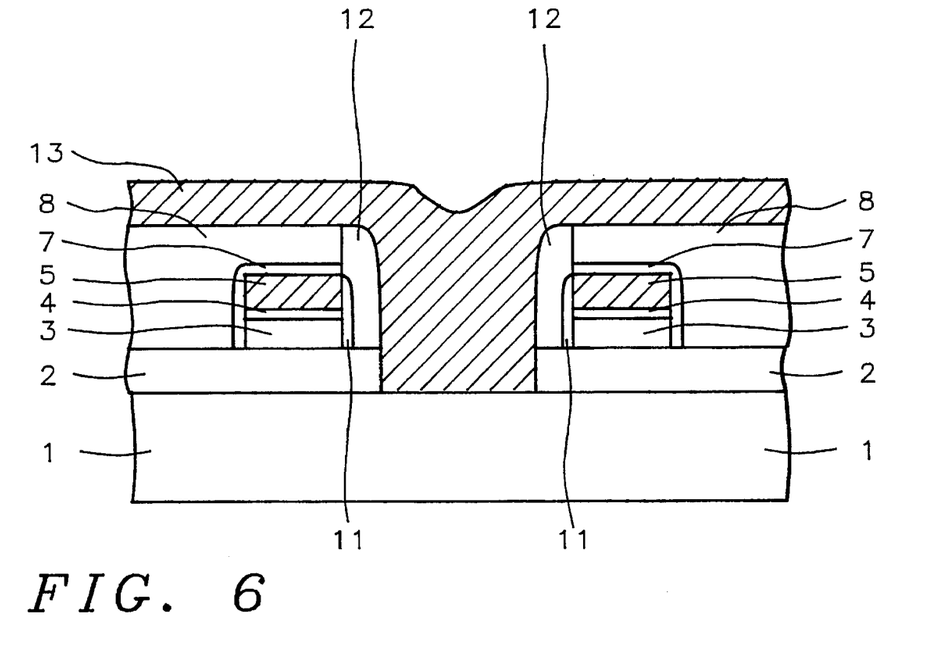
Figure 7:
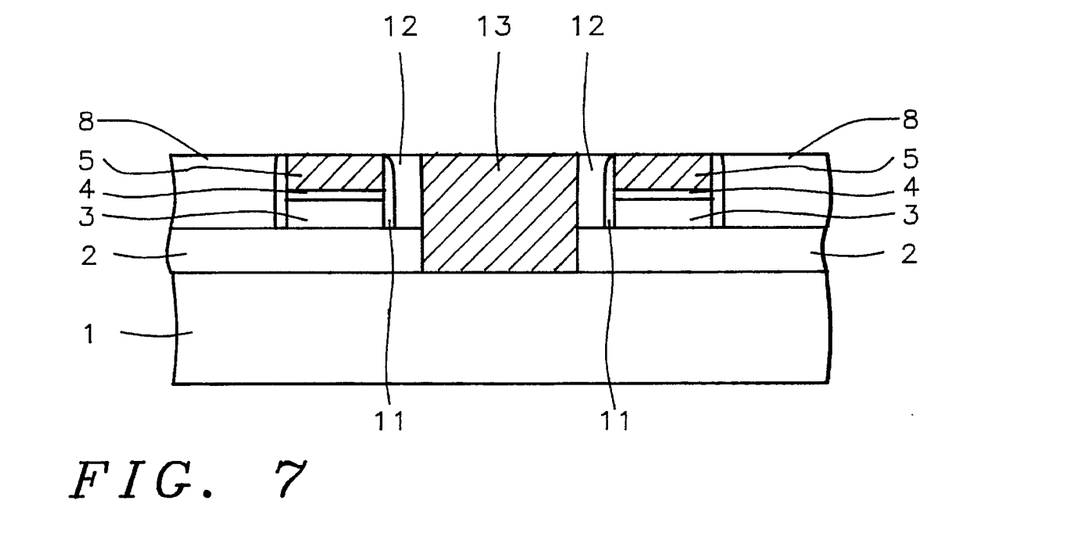

A second polysilicon layer, 13, is now deposited, using LPCVD, in-situ doping procedures, accomplished by including arsine or phosphine to the silane ambient, at a temperature between about 600° to 650° C., to a thickness between about 1500 to 4000 Angstroms, shown schematically in FIG. 6. Chemical mechanical polishing, (CMP), selective to removal of polysilicon, is used to remove the unwanted second polysilicon layer from all areas except from the trench fill. Another CMP procedure, selective to insulator removal, is used to remove the remaining thin silicon oxide layer, 8, from areas overlying the polysilicon structure, 5. This can be observed, schematically in FIG. 7.

Figure 8:
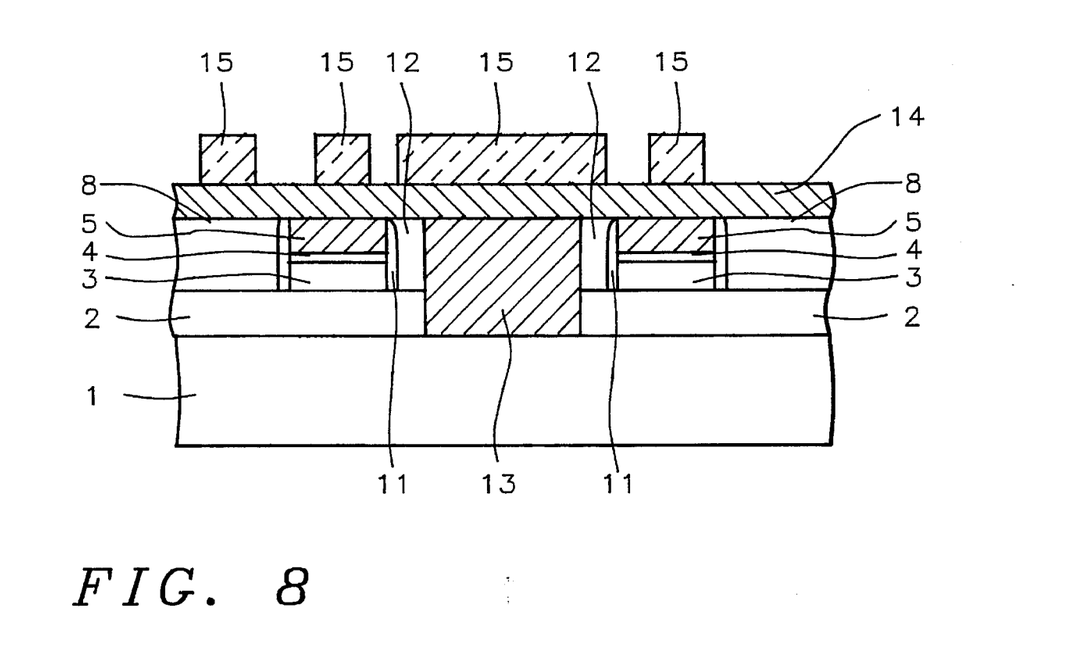
FIGS. 8–10, schematically, in cross-sectional representation, showing the creation of a MOSFET device, a back gate contact structure, and a polysilicon resistor.
Figure 9:
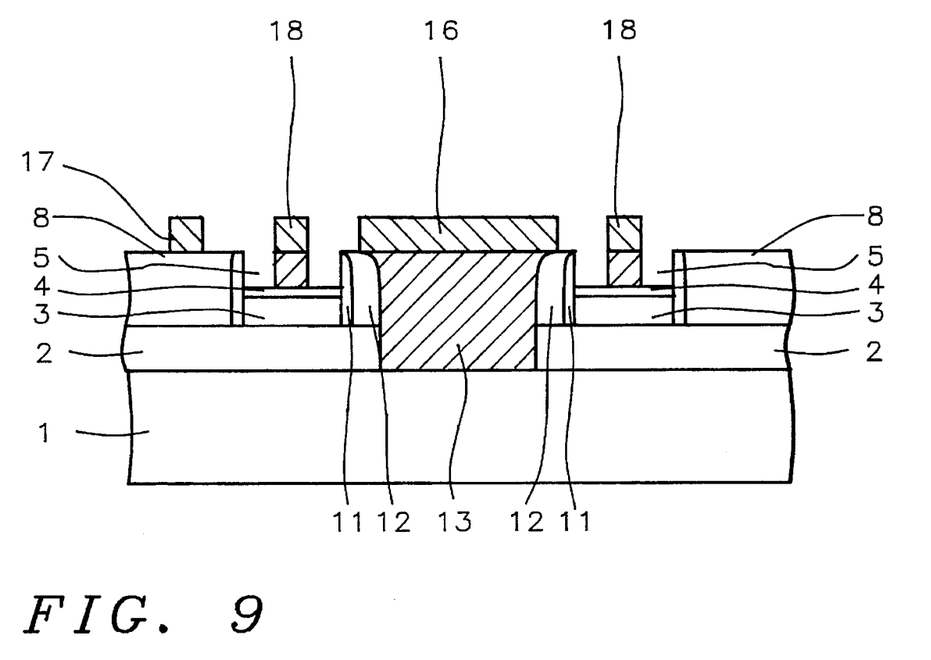

After careful cleans, a third polysilicon layer, 14, is deposited using LPCVD processing, at a temperature between about 600° to 650° C., to a thickness between about 500 to 2000 Angstroms. Doping of polysilicon layer, 14, is accomplished via ion implantation of arsenic, or phosphorous, at an energy between about 40 to 80 KeV, at a dose between about 1E15 to 1E16 atoms/cm$^2$. Photolithographic processing is employed to create photoresist shapes, 15, shown in FIG. 8. A selective, anisotropic RIE procedure, again using a Cl$_2$, or a Cl$_2$—HBr etchant, is used to define several structures. First a back gate contact, 16, is created via the dry etching of third polysilicon layer, 14, stopping on spacer oxide surface, 12. The etching procedure also produces polysilicon resistor structure, 17, again by etching third polysilicon layer, 14, and stopping on insulator layer, 8. Polysilicon gate structures, 18, are formed during this etching procedure, by the etching of third polysilicon layer, 14, and first polysilicon layer, 5, stopping on silicon dioxide layer, 4. These structures are shown schematically in FIG. 9, following a photoresist removal step, carried out using oxygen plasma ashing.

Figure 10:
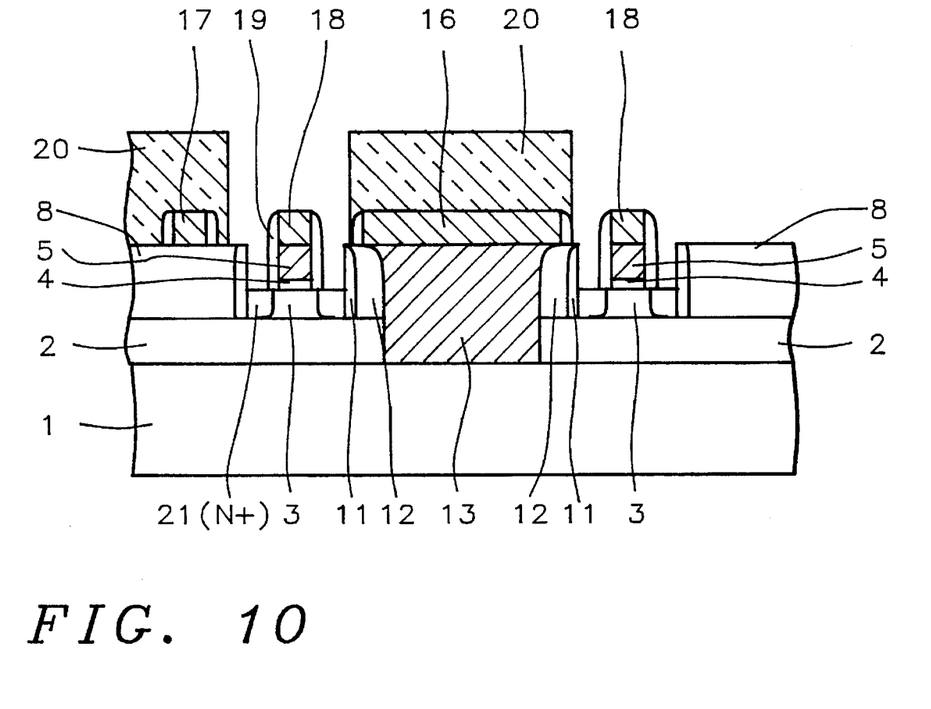

The next series of steps are used to complete the fabrication of the MOSFET device. First another silicon oxide layer is deposited again using either LPCVD or PECVD processing, at a temperature between about 400° to 850° C., to a thickness between about 1500 to 2500 Angstroms. A selective, anisotropic RIE procedure, using CHF$_3$ as an etchant, is used to create insulator sidewall spacer, 19, shown in FIG. 10. Next photolithographic processing is used to create photoresist block out layer, 20, and an ion implantation of arsenic is performed at a energy between about 40 to 80 Key., at a dose between about 1E15 to 1E16 atoms/cm$^2$, to create source and drain regions 21, shown schematically in FIG. 10.

Figure 11:
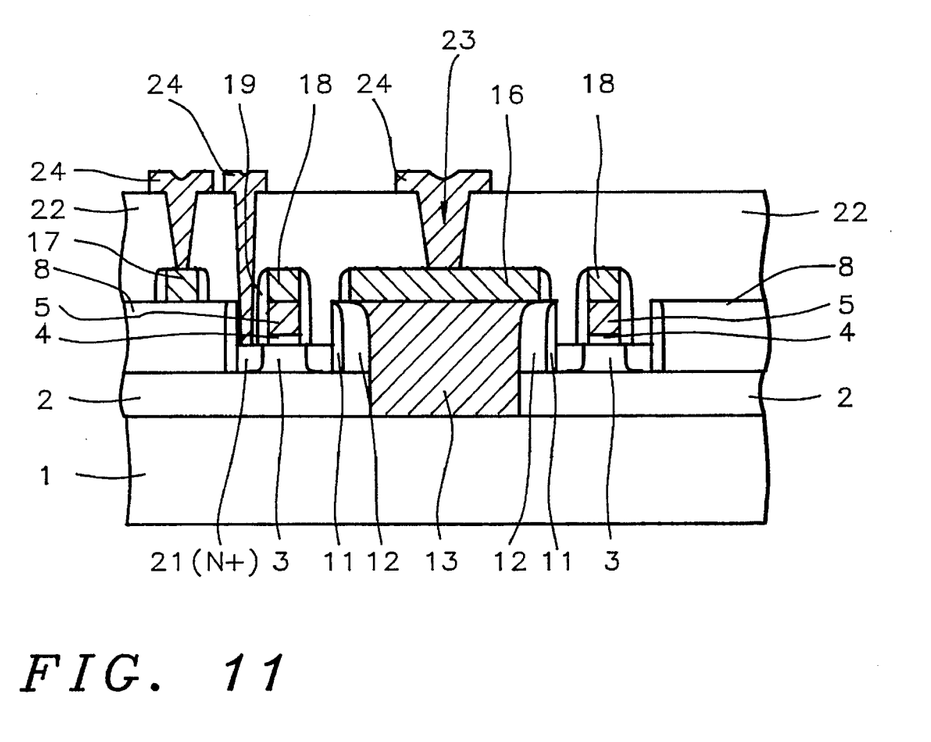
FIG. 11, schematically showing a metallized MOSFET device, a metallized back gate contact structure, and a metallized polysilicon resistor structure.

After photoresist removal using oxygen plasma ashing, followed by careful wet cleans, a boro-phosphosilicate, (BPSG), layer, 22, is deposited, using either PECVD or atmospheric pressure chemical vapor deposition, (APCVD), processing, at a temperature between about 400° to 850° C., to a thickness between about 5000 to 10000 Angstroms, and followed by a reflow procedure at a temperature between about 825° to 925° C., to improve the planarity of BPSG layer, 22. Conventional photolithographic and RIE processing, using CHF$_3$ as an etchant, are used to create contact holes, 23, to the back gate contact, 16, to the polysilicon resistor structure, 17, and to the MOSFET source and drain regions, 21. Contact hole are also formed to polysilicon gate structure 18, however not shown in FIG. 11. After photoresist removal using oxygen plasma ashing, followed by careful wet cleans, including a buffered hydrofluoric exposure to remove native oxide, a deposition of an aluminum based metallurgy is performed using r.f. sputtering procedures, to a thickness between about 5000 to 8000 Angstroms. Standard photolithographic and RIE procedures, using a Cl$_2$ containing etchant, are used to form metal structures, 24, shown in FIG. 11. Again photoresist removal is performed via oxygen plasma ashing, followed by careful wet cleans.

Although this process for creating a back gate contact, for a MOSFET device in a SOI layer, has been shown for a N channel, (NFET) device, one can easily choose materials and dopants to create the identical back gate contact for P channel, (PFET), devices. In addition this process can be used to create complimentary, (CMOS), devices, in which both N channel and P channel MOSFETs are together fabricated using a back gate contact. Bipolar—CMOS designs, (BiCMOS), can also be fabricated with a back gate contact, using the process described in this invention.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating silicon devices, in a layer of silicon on a first insulator layer, on a semiconductor substrate, incorporating a back gate contact for said silicon devices, to said semiconductor substrate, comprising the steps of:

providing said semiconductor substrate;

providing said first insulator layer, on said semiconductor substrate;

providing said silicon layer, on said first insulator layer, on said semiconductor substrate;

growing a second insulator layer on a surface of said silicon, on said first insulator layer;

depositing a first polysilicon layer on said second insulator layer;

ion implanting a first conductivity imparting dopant into said first polysilicon layer;

patterning of said first polysilicon layer to form polysilicon structures;

growing a first sidewall oxide on exposed surfaces of said polysilicon structures;

depositing a third insulator layer on said polysilicon structures, and between said polysilicon structures;

first photoresist masking to expose a region of said first sidewall oxide, and underlying said polysilicon structures;

anisotropic etching of said third insulator layer, of said first sidewall oxide, of said polysilicon structures, of said second insulator layer, and of said silicon layer, in said exposed region of said first photoresist masking, to create a trench;

removal of said first photoresist masking;

growing a second sidewall oxide on exposed surfaces of said polysilicon structures, and exposed surfaces of said silicon layer, in said trench;

depositing a fourth insulator layer at the bottom and sides of said trench, and one a surface of said third insulator layer;

anisotropic etching of said fourth insulator layer to form first insulator sidewall spaces on sides of said trench, while removing said fourth insulator layer from the surface of said third insulator layer;

anisotropic etching of said first insulator layer, at a bottom of said trench, to extend said trench to a surface of said semiconductor substrate, while thinning said third insulator layer;

depositing a second polysilicon layer in said trench, and on the surface of said third insulator layer;

removal of said second polysilicon layer from the surface of said third insulator layer;

removal of said third insulator layer, and of said first sidewall oxide, from the surface of said polysilicon structures;

depositing a third layer of polysilicon on the surface of said third insulator layer, between said polysilicon structures, on the surface of said polysilicon structures, and on a surface of said second polysilicon layer, in said trench;

ion implanting a second conductivity imparting dopant into said third polysilicon layer;

patterning: of said third polysilicon layer, overlying said second polysilicon layer, in said trench, to form said back gate contact structure; of said third polysilicon layer, overlying said third insulator layer, to form a polysilicon resistor structure; and of said third polysilicon layer and said first polysilicon layer, overlying said second insulator layer, to form polysilicon gates;

depositing a fifth insulator layer;

anisotropic etching of said fifth insulator layer to form second insulator sidewall spacers on sides of said polysilicon gates, on sides of said polysilicon resistor structure, and on sides of said back gate contact structure;

a second photoresist masking to expose only a region of said silicon layer, and said polysilicon gates;

ion implanting a third conductivity imparting dopant into said region of said silicon layer, not covered by said polysilicon gates, and not covered by said second photoresist masking;

removal of said second photoresist masking;

deposition of a sixth insulator layer;

opening contact holes in said sixth insulator layer, to said back gate contact structure, to said polysilicon resistor structure, and to said region of said silicon layer;

deposition of a metal; and forming metal contact structures to said back gate contact structure, to said polysilicon resistor structure, and to said region of said silicon layer.

2. The method of claim 1, wherein said silicon layer, on insulator layer, produced by a SIMOX, (Separation of IMplanted OXygen) process, is a P type layer, with a resistivity between about 5 to 25 ohm-cm, having a <100> crystallographic orientation, and a thickness between about 800 to 3000 Angstroms.

3. The method of claim 1, wherein said second insulator layer is silicon dioxide, thermally grown in an oxygen —steam ambient, at a temperature between about 800° to 900° C., to a thickness between about 50 to 200 Angstroms.

4. The method of claim 1, wherein said first polysilicon layer is deposited using LPCVD processing, at a temperature between about 600° to 650° C., to a thickness between about 1500 to 4000 Angstroms.

5. The method of claim 1, wherein said first conductivity imparting dopant is phosphorous, ion implanted at an energy between about 30 to 70 Kev., at a dose between about 1E14 to 1E16 atoms/cm$^2$.

6. The method of claim 1, wherein said third insulator layer is silicon oxide, deposited using either LPCVD or PECVD processing at a temperature between about 400° to 850° C., to a thickness between about 3000 to 5000 Angstroms.

7. The method of claim 1, wherein said trench is reactively ion etched using $CHF_3$—$CF_4$, to etch said third insulator layer and said first sidewall oxide layer, using $Cl_2$, or $Cl_2$—HBr, to etch said first polysilicon layer, again using $CHF_3$—$CF_4$, to etch said second insulator layer, and again using $Cl_2$, or $Cl_2$—HBr, to etch said silicon layer, on said first insulator layer.

8. The method of claim 1, wherein said fourth insulator layer, used to form said first insulator sidewall spacers, on sides of said trench, is silicon oxide, deposited using LPCVD or PECVD processing, at a temperature between about 400° to 850° C., to a thickness between about 2000 to 5000 Angstroms.

9. The method of claim 1, wherein said first insulator layer, at bottom of said trench, is removed via reactive ion etching, using $CHF_3$—$CF_4$.

10. The method of claim 1, wherein said second polysilicon is deposited using LPCVD processing, using in-situ doping by addition of arsine or phosphine to the silane ambient, at a temperature between about 600° to 650° C., to a thickness between about 1500 to 4000 Angstroms.

11. The method of claim 1, wherein said second polysilicon removal, leaving only said second polysilicon layer in said trench, is accomplished using chemical mechanical polishing.

12. The method of claim 1, wherein said third polysilicon layer is deposited using LPCVD processing, at a temperature between about 600° to 650° C., to a thickness between about 500 to 2000 Angstroms.

13. The method of claim 1, wherein said second conductivity imparting dopant is arsenic, or phosphorous, ion implanted at an energy between about 40 to 80 KeV, at a dose between about 1E15 to 1E16 atoms/cm$^2$.

14. The method of claim 1, wherein said third conductivity imparting dopant is arsenic, or phosphorous, ion implanted at an energy between about 40 to 80 KeV, at a dose between about 1E15 to 1E16 atoms/cm$^2$.

15. A method for fabricating MOSFET devices, and polysilicon resistors, in a layer of silicon on a first insulator layer, on a semiconductor substrate, incorporating a back gate contact, for said MOSFET device, to said semiconductor substrate, comprising the steps of:

providing said semiconductor substrate;

providing said first insulator layer, on said semiconductor substrate;

growing a second insulator layer, on a surface of said silicon layer, to be used as a gate oxide of said MOSFET device;

depositing a first polysilicon layer on said gate oxide;

ion implanting a first conductivity imparting dopant into said first polysilicon layer;

patterning of said first polysilicon layer to form polysilicon structures;

growing a first sidewall oxide on exposed surfaces of said polysilicon structures;

depositing a third insulator layer on said polysilicon structures, and between said polysilicon structures;

first photoresist masking to expose a region of said first sidewall oxide, and underlying said polysilicon structures;

anisotropic etching of said third insulator layer, of said first sidewall oxide, of said polysilicon structures, of said gate oxide, and of said silicon layer, in an exposed region of said first photoresist masking, to create a trench;

removal of said first photoresist masking;

growing a second sidewall oxide on exposed surfaces of said polysilicon structures, and exposed surfaces of said silicon layer, in said trench;

deposition of a fourth insulator layer, on bottom and sides of said trench, and on a surface of said third insulator layer;

anisotropic etching of said fourth insulator layer to form trench sidewall spacers, on sides of said trench, and completely removing said fourth insulator layer from the surface of said third insulator layer;

anisotropic etching of said first insulator layer, at bottom of said trench, to extend said trench to a surface of said semiconductor substrate, while thinning said third insulator layer;

deposition of a second polysilicon layer in said trench, and on the surface of said third insulator layer;

removal of said second polysilicon layer from the surface of said third insulator layer, leaving a polysilicon filled trench;

removal of said third insulator layer, and said first sidewall oxide, from the surface of said polysilicon structures;

deposition of a third layer of polysilicon on the surface of said polysilicon structures, on the third insulator layer, between said polysilicon structures, and on a surface of said polysilicon filled trench;

ion implanting a second conductivity imparting dopant into said third polysilicon layer;

patterning: of said third polysilicon layer, overlying said polysilicon filled trench, to form said back gate contact structures; of said third polysilicon layer, overlying said third insulator layer, to form a polysilicon resistor structures; and of said third polysilicon layer and said first polysilicon layer, overlying said gate oxide, to form polysilicon gates for said MOSFET device;

deposition of a fifth insulator layer;

anisotropic etching of said fifth insulator layer to form MOSFET sidewall spacers, on sides of said polysilicon gates, and insulator sidewall spacers on sides of, said polysilicon resistor structures, and on sides of said back gate contact structures;

a second photoresist masking to expose MOSFET regions;

ion implanting a third conductivity imparting dopant into said MOSFET regions, to create source and drain regions;

removal of said second photoresist masking;

deposition of a sixth insulator layer;

opening contact holes in said sixth insulator layer, to said back gate contact structures, to said polysilicon resistor structures, and to said regions of said MOSFET device;

deposition of a metal; and forming metal contact structures to said back gate contact structures, to said polysilicon resistor structures, and to said regions of said MOSFET device.

16. The method of claim 15, wherein said silicon layer, on said insulator layer, is produced by a SIMOX, (Separation of IMplanted OXygen), process, and is P type with a resistivity between about 5 to 25 ohm —cm, with a <100> crystallographic orientation, and a thickness between about 800 to 3000 Angstroms.

17. The method of claim 15, wherein said gate oxide, of said MOSFET device, is silicon dioxide, thermally grown in an oxygen—steam ambient, at a temperature between about 800° to 900° C., to a thickness between about 50 to 200 Angstroms.

18. The method of claim 15, wherein said first polysilicon layer is deposited using LPCVD processing, at a temperature between about 600° to 650° C., to a thickness between about 1500 to 4000 Angstroms.

19. The method of claim 15, wherein said first conductivity imparting dopant is phosphorous, ion implanted at an energy between about 30 to 70 KeV, at a dose between about 1E14 to 1E16 atoms/cm$^2$.

20. The method of claim 15, wherein said third insulator layer is silicon oxide, deposited using either LPCVD or PECVD processing, at a temperature between about 400° to 850° C., to a thickness between about 3000 to 5000 Angstroms.

21. The method of claim 15, wherein said trench is formed via reactive ion etching, using $CHF_3$—$CF_4$, to etch said third insulator layer and said first sidewall oxide layer, using $Cl_2$, or $Cl_2$—HBr, to etch said polysilicon structures, using $CHF_3$—$CF_4$, to etch said gate oxide, and $Cl_2$, or $Cl_2$—HBr, to etch said silicon layer, on said first insulator layer.

22. The method of claim 15, wherein said fourth insulator layer, used to form said trench sidewall spacer, is silicon oxide, deposited using LPCVD or PECVD processing, at a temperature between about 400° to 850° C., to a thickness between about 2000 to 5000 Angstroms.

23. The method of claim 15, wherein said first insulator layer, at bottom of said trench, is removed via reactive ion etching using $CHF_3$—$CF_4$.

24. The method of claim 15, wherein said second polysilicon layer, used to fill said trench, is deposited using LPCVD, in-situ doping, processing, adding phosphine or arsine to the silane ambient, at a temperature between about 600° to 650° C., to a thickness of 1500 to 4000 Angstroms.

25. The method of claim 1, wherein said second polysilicon layer is removed from surface of said third insulator layer, via chemical mechanical polishing procedures.

26. The method of claim 15, wherein said third polysilicon layer is deposited using LPCVD processing, at a temperature between about 600° to 650° C., to a thickness between about 500 to 2000 Angstroms.

27. The method of claim 15, wherein said second conductivity dopant is arsenic, or phosphorous, ion implanted at an energy between about 40 to 80 KeV, at a dose between about 1E15 to 1E16 atoms/$cm^2$.

28. The method of claim 15, wherein said third conductivity dopant, used to form said source and drain regions of said MOSFET device, is arsenic, or phosphorous, ion implanted at an energy between about 40 to 80 KeV, at a dose between about 1E15 to 1E16 atoms/$cm^2$.

* * * * *